(12) United States Patent
Xiao et al.

(10) Patent No.: US 10,514,592 B2
(45) Date of Patent: Dec. 24, 2019

(54) TELESCOPIC CAMERA MECHANISM AND ELECTRONIC DEVICE

(71) Applicant: JRD COMMUNICATION (SHENZHEN) LTD, Shenzhen, Guangdong (CN)

(72) Inventors: Junhui Xiao, Guangdong (CN); Huilin Huang, Guangdong (CN)

(73) Assignee: JRD COMMUNICATION (SHENZHEN) LTD, Shenzhen (CN)

( * ) Notice: Subject to any disclaimer, the term of this patent is extended or adjusted under 35 U.S.C. 154(b) by 0 days.

(21) Appl. No.: 16/314,857

(22) PCT Filed: Aug. 31, 2017

(86) PCT No.: PCT/CN2017/100000
§ 371 (c)(1),
(2) Date: Jan. 2, 2019

(87) PCT Pub. No.: WO2018/076925
PCT Pub. Date: May 3, 2018

(65) Prior Publication Data
US 2019/0310533 A1 Oct. 10, 2019

(30) Foreign Application Priority Data
Oct. 26, 2016 (CN) .......................... 2016 1 0946302

(51) Int. Cl.
*G03B 17/04* (2006.01)
*H04N 5/225* (2006.01)
(Continued)

(52) U.S. Cl.
CPC ............... *G03B 17/04* (2013.01); *G01R 1/02* (2013.01); *G02B 7/04* (2013.01); *G03B 17/561* (2013.01);
(Continued)

(58) Field of Classification Search
CPC .................................................... G03B 17/043
See application file for complete search history.

(56) References Cited

U.S. PATENT DOCUMENTS 10,208,525 B2 * 2/2019 Schuetz .................. E05F 15/73
2004/0228626 A1 11/2004 Endo et al.
(Continued)

FOREIGN PATENT DOCUMENTS

CN 1731830 A 2/2006
CN 104113677 A 10/2014
(Continued)

*Primary Examiner* — Clayton E. LaBalle
*Assistant Examiner* — Leon W Rhodes, Jr.

(57) ABSTRACT

The present disclosure discloses a telescopic camera mechanism, which includes a holder having a holding cavity, a camera is placed in the holding cavity, and a top of the camera is provided with a protective cover, the holder is further equipped with a protective cover movement component and a camera telescopic component, wherein the protective cover movement component includes a rotating motor, a screw rod, and a guide plate, the screw rod is connected to a lateral face of the holding cavity, the guide plate is sleeved on the screw rod, and a top end of the guide plate is fixedly connected to the protective cover, the camera telescopic component includes a support spring strip and a poke rod, wherein the support spring strip is connected to a bottom of the camera and is fixedly connected to the holder, and the poke rod is movably connected to the holder.

20 Claims, 7 Drawing Sheets

(51) Int. Cl.
  *G01R 1/02* (2006.01)
  *G03B 17/56* (2006.01)
  *G02B 7/04* (2006.01)
(52) U.S. Cl.
  CPC ......... *H04N 5/2252* (2013.01); *H04N 5/2254* (2013.01)

(56) References Cited

U.S. PATENT DOCUMENTS

| | | |
|---|---|---|
| 2005/0225668 A1 | 10/2005 | Kim |
| 2007/0212059 A1* | 9/2007 | Kim ...................... G03B 29/00 396/448 |
| 2009/0309971 A1 | 12/2009 | Schuetz |
| 2014/0037283 A1 | 2/2014 | Cury |
| 2017/0001578 A1 | 1/2017 | Buschmann et al. |
| 2019/0241130 A1* | 8/2019 | Wietkamp ............. B60R 11/04 |
| 2019/0310533 A1 | 10/2019 | Xiao et al. |

FOREIGN PATENT DOCUMENTS

| | | |
|---|---|---|
| CN | 204989718 U | 1/2016 |
| WO | WO-2014034388 A1 * | 3/2014 |

* cited by examiner

TELESCOPIC CAMERA MECHANISM AND ELECTRONIC DEVICE

CROSS-REFERENCE TO RELATED APPLICATIONS

The present application is a 35 U.S.C. § 371 National Phase conversion of International (PCT) Patent Application No. PCT/CN2017/100000 filed on Aug. 31, 2017, which claims foreign priority of Chinese Patent Application No. 201610946302.7, filed on Oct. 26, 2016 in the State Intellectual Property Office of China, the contents of all of which are hereby incorporated by reference.

TECHNICAL FIELD

The present disclosure relates to an electronic device having a camera function, and more particularly, to a telescopic camera mechanism used in the electronic device.

BACKGROUND

In the era of mobile Internet, there are unlimited business opportunities in the intelligent terminal markets, and competitions among world-renowned manufacturers have become more and more fierce, and they aggressively seize the market. Recently, the development momentum of domestic smart mobile phones has also been quite strong, and their market shares have been greatly increased, and transverse widescreen and super-large screen have become a major trend in the development of mobile phones. As the large-screen smart mobile phones are more and more popular among users, manufacturers pay more attention to the user experience, and whether the mobile phone camera functions are powerful is an important indicator that users should consider when purchasing mobile phones. Therefore, current smart mobile phones are equipped with high-quality cameras. However, the cameras in the mobile phones generally are fixed in location, and surfaces of the cameras protrude from surfaces of the mobile phone shells, such that the cameras are easy to wear and tear in daily use, which has a serious effect on the imaging quality. For some mobile phones equipped with high-pixel cameras, this effect is even more obvious.

SUMMARY

On this account, the present disclosure provides a telescopic camera mechanism. The telescopic camera mechanism has a protective cover and its camera is telescopic. When in use, the camera extends out, such that a photographing angle of the camera may be increased. When not in use, the camera is retracted into the protective cover, such that the camera may be effectively protected.

To achieve the above objectives, the present disclosure adopts the following technical solutions.

A telescopic camera mechanism includes a holder having a holding cavity, a camera placed in the holding cavity, and a top of the camera provided with a protective cover, the holder is further equipped with a protective cover movement component and a camera telescopic component, wherein the protective cover movement component includes a rotating motor, a screw rod, and a guide plate, the screw rod is connected to a lateral face of the holding cavity, the guide plate is sleeved on the screw rod, and a top end of the guide plate is fixedly connected to the protective cover, driven by the rotating motor, the screw rod rotates to drive the guide plate to move on the screw rod along a direction close to or away from the holding cavity to drive the protective cover to move, such that the camera is sheltered or exposed, the camera telescopic component includes a support spring strip and a poke rod, wherein the support spring strip is connected to a bottom of the camera and is fixedly connected to the holder, and the poke rod is movably connected to the holder, when the guide plate moves such that the camera is entirely exposed, the guide plate applies an acting force to the poke rod to press against the support spring strip, such that the camera extends out of the holding cavity, when the guide plate moves towards the direction close to the holding cavity, the guide plate relieves the acting force applied to the poke rod, such that the support spring strip drives the camera to retract into the holding cavity.

Specifically, the guide plate is provided with a screw hole fitting with the screw rod, and the guide plate is sleeved on the screw rod through the screw hole.

Specifically, the rotating motor is connected to the screw rod through a gear assembly.

Specifically, the poke rod is rotatably connected to the holder through a rotating shaft, a first end of the poke rod extends to a relative upward side of the screw rod away from an end of the holding cavity, and a second end of the poke rod extends to a relative upward side of the support spring strip, When the guide plate presses against the first end of the poke rod, the second end of the poke rod presses against the support spring strip, when the guide plate relieves pressure against the first end of the poke rod, the second end of the poke rod relieves pressure against the support spring strip.

Specifically, the protective cover includes a left protective cover and a right protective cover, and the protective cover movement component includes a left screw rod, a right screw rod, a left guide plate, and a right guide plate, the left screw rod and the right screw rod are respectively connected to two opposite lateral faces of the holding cavity, the left guide plate is sleeved on the left screw rod and is connected to the left protective cover, and the right guide plate is sleeved on the right screw rod and is connected to the right protective cover, the left screw rod and the right screw rod are synchronously driven by the rotating motor, the camera telescopic component includes a left poke rod and a right poke rod, wherein the left poke rod is positioned between the support spring strip and the left guide plate, and the right poke rod is positioned between the support spring strip and the right guide plate.

Specifically, the left protective cover and the right protective cover, the left screw rod and the right screw rod, the left guide plate and the right guide plate, and the left poke rod and the right poke rod are bilaterally symmetrically assembled at two opposite sides of the holding cavity.

Further, two cameras configured towards opposite directions are placed in the holding cavity, wherein a top of each of the cameras is respectively provided with one protective cover, each of the cameras is correspondingly provided with the protective cover movement component and the camera telescopic component.

The two protective cover movement components corresponding to the two cameras share the rotating motor.

Another aspect of the present disclosure provides an electronic device, which includes a camera apparatus, wherein the camera apparatus includes the aforementioned telescopic camera mechanism.

Specifically, the electronic device is a smart mobile phone or a tablet computer.

Embodiments of the present disclosure provide a telescopic camera mechanism and an electronic device. The camera mechanism is provided with a protective cover, a protective cover movement component, and a camera telescopic component. When the camera is not in use, the camera telescopic component drives the camera to retract into the protective cover, such that the camera may be effectively protected. When the camera is in use, the protective cover movement component moves the protective cover such that the camera is exposed, then the camera telescopic component drives the camera to extend out, such that a photographing angle of the camera may be increased, and product competitiveness is enhanced.

DETAILED DESCRIPTION

To make the objectives, technical solutions and advantages of the present disclosure clearer, the specific embodiments of the present disclosure are described in detail below with reference to the accompanying drawings. Examples of these preferred embodiments are illustrated in the accompanying drawings. The embodiments of the present disclosure shown in the accompanying drawings and described according to the accompanying drawings are exemplary and explanatory only, and the present disclosure are not limited thereto.

Hereon, it is to be explained that in order to avoid obscuring the present disclosure due to unnecessary details, in the accompanying drawings merely structures and/or processing steps closely related to the solution according to the present disclosure are shown, and other details little related to the present disclosure are omitted.

Embodiment 1

Referring to FIG. 1-FIG. 8, this embodiment provides a telescopic camera mechanism, which may include a holder 1 having holding cavities 11 and 12. Cameras 21 and 22 may be placed in the holding cavities 11 and 12, and tops of the cameras 21 and 22 may be provided with a protective cover 3. The holder 1 may be further equipped with a protective cover movement component and a camera telescopic component. The protective cover movement component may be mainly used for moving the protective cover 3 arranged on the tops of the cameras 21 and 22, such that the cameras 21 and 22 may be sheltered or exposed. When the cameras 21 and 22 are sheltered, the camera telescopic component drives the cameras 21 and 22 to retract into the holding cavities 11 and 12. When the cameras 21 and 22 are exposed, the camera telescopic component drives the cameras 21 and 22 to extend out of the holding cavities 11 and 12.

Figure 1:
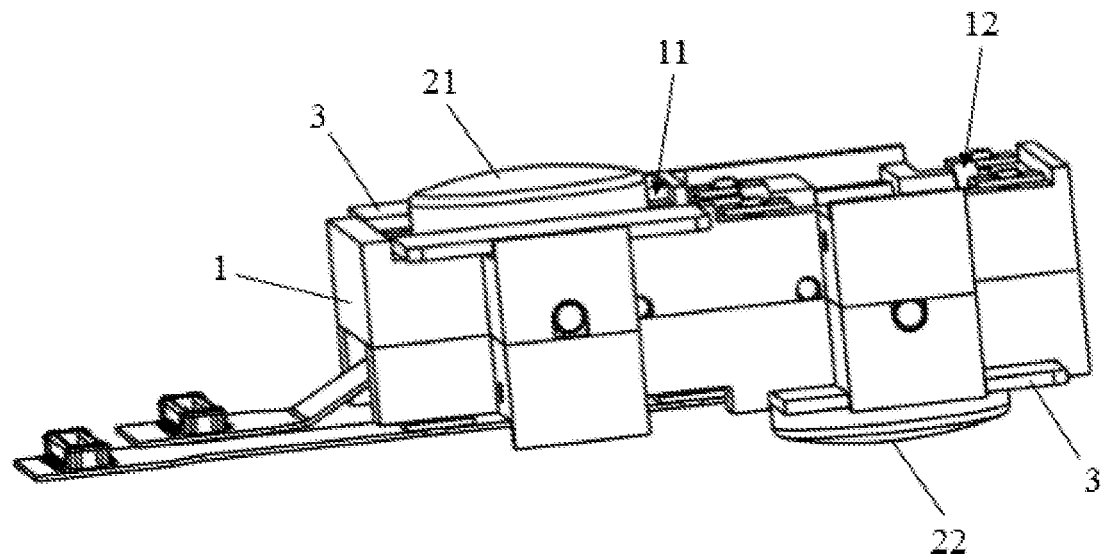
FIG. 1 is a schematic structural side view of a telescopic camera mechanism according to Embodiment 1 of the present disclosure.
Figure 2:
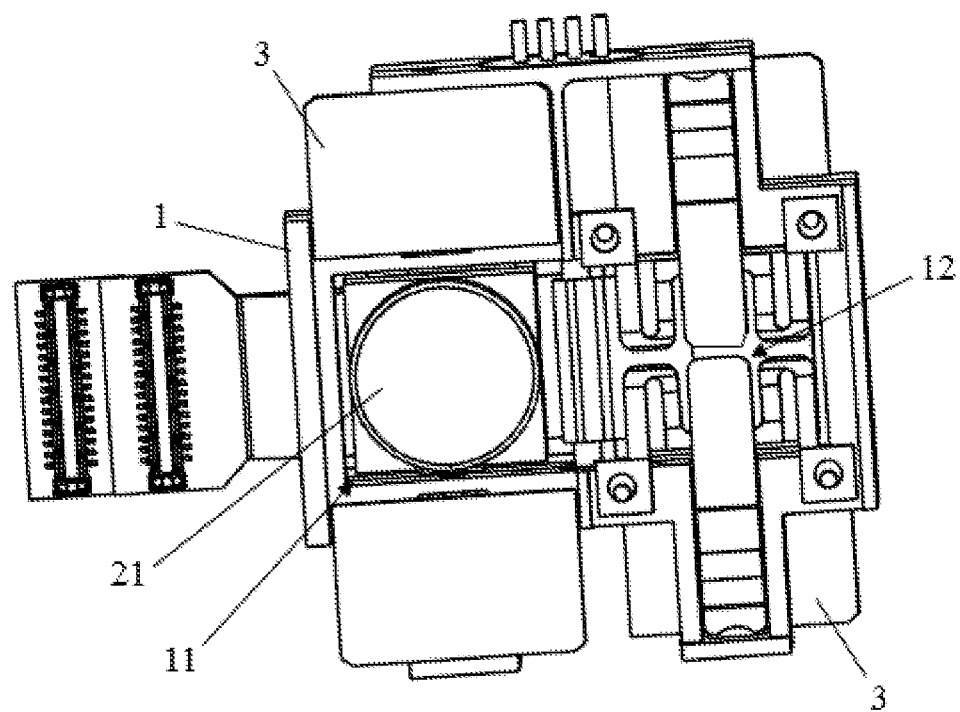
FIG. 2 is a schematic structural top view of the telescopic camera mechanism according to Embodiment 1 of the present disclosure.

In this embodiment, as shown in FIG. 1 and FIG. 2, the telescopic camera mechanism in this embodiment may include two cameras 21 and 22. That is, the camera 21 may be placed in the holding cavity 11, the camera 22 may be placed in the holding cavity 12, and the two cameras 21 and 22 may be configured towards opposite directions. It may be understood that the camera 21 may be configured towards the front face of the holder 1, whereas the camera 22 may be configured towards the rear face of the holder 1. It may be understood that the camera 21 and the camera 22 are respectively provided with their own protective covers 3, protective cover movement components and camera telescopic components. The protective covers 3, the protective cover movement components and the camera telescopic components respectively corresponding to the camera 21 and the camera 22 may be identical in structure, but the two cameras 21 and 22 face different directions. Therefore, the protective covers 3, the protective cover movement components and the camera telescopic components respectively corresponding to the camera 21 and the camera 22 may be different in location in the holder 1. For example, the protective cover 3 corresponding to the camera 21 may be positioned on the top of the camera 21, i.e., positioned towards the front face of holder 1. On the contrary, the protective cover 3 corresponding to the camera 22 may be positioned on the top of the camera 22, i.e., positioned towards the rear face of holder 1. It is to be noted that in some other embodiments, the telescopic camera mechanism also may merely include one camera. For example, only the camera 21 or the camera 22 in this embodiment and their corresponding protective covers 3, the protective cover movement components and the camera telescopic components may be retained.

Figure 3:
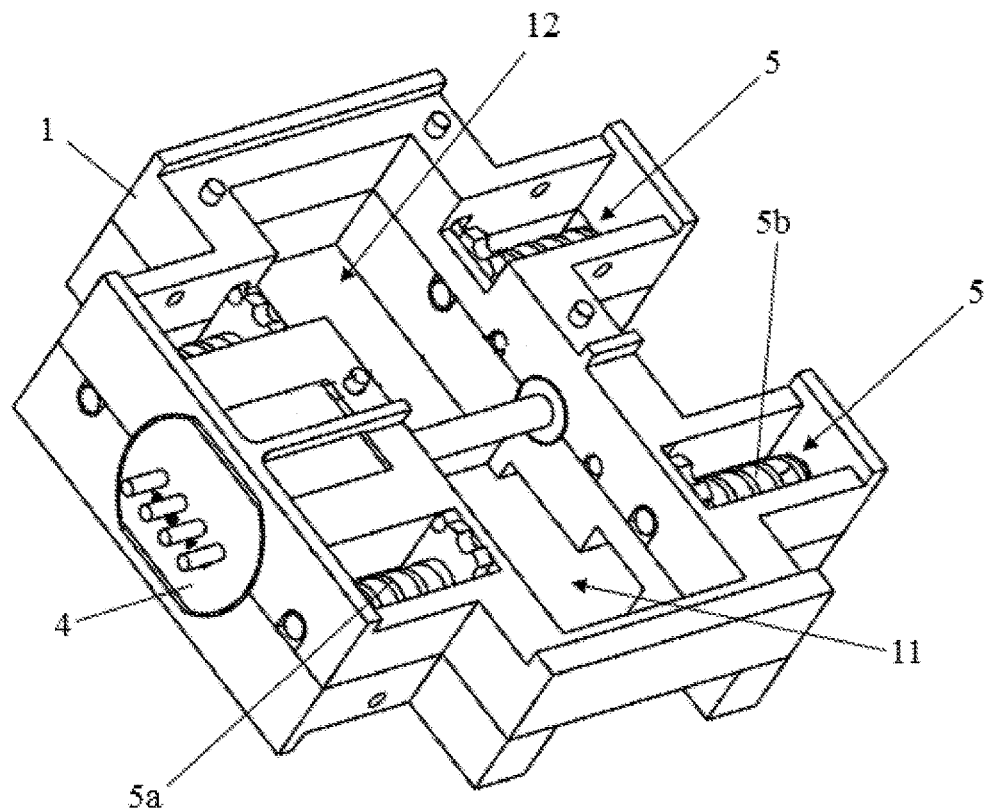
FIG. 3 and FIG. 4 are schematic structural views of a holder according to Embodiment 1 of the present disclosure.
Figure 4:
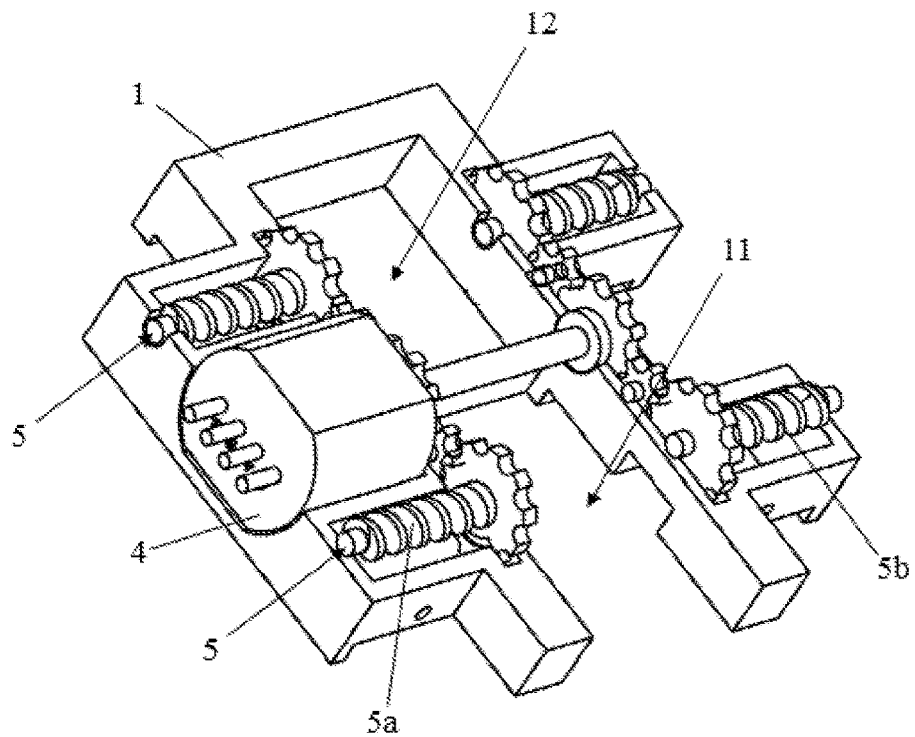
Figure 5:
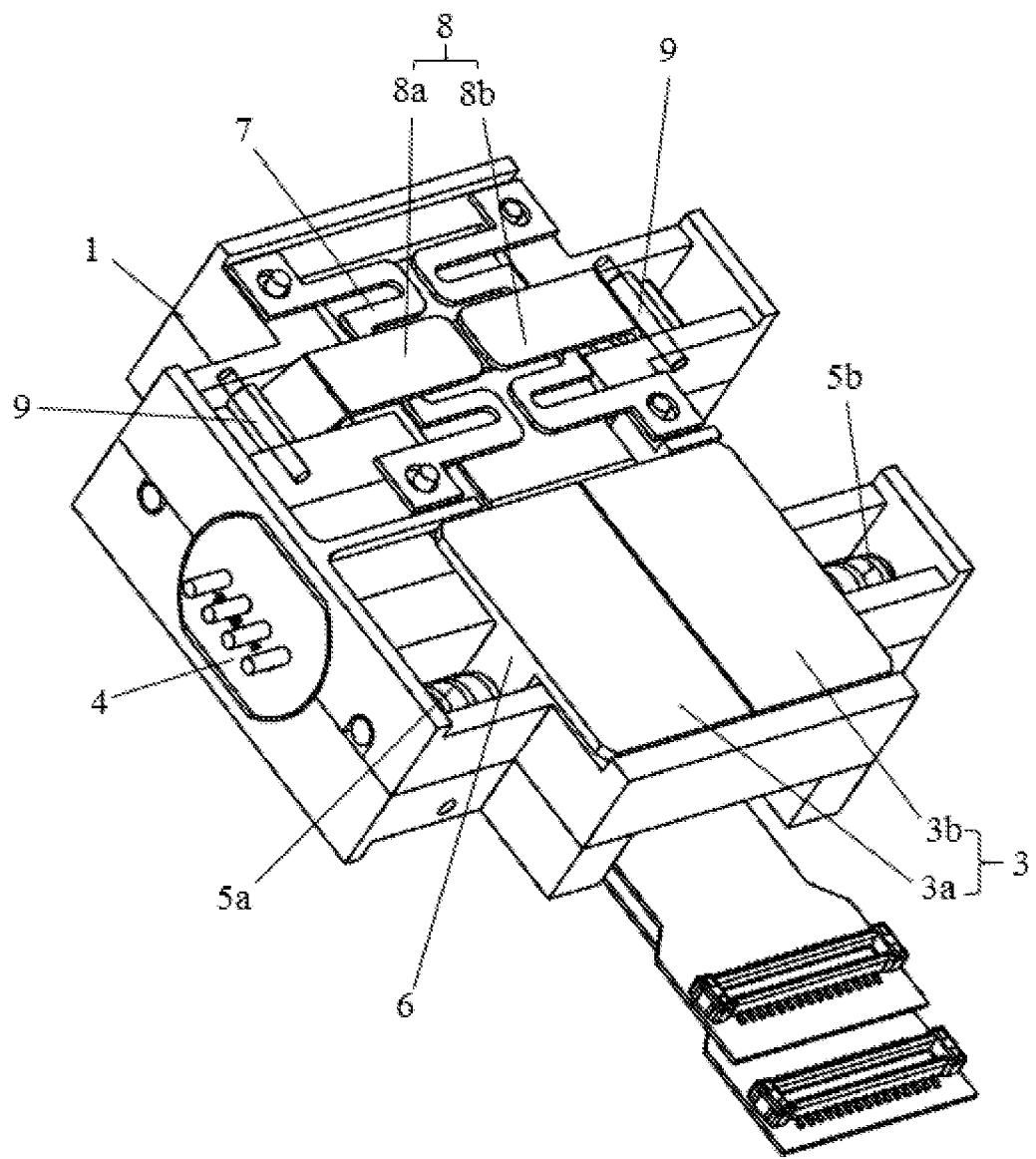
FIG. 5 and FIG. 6 are perspective schematic structural views of the telescopic camera mechanism in a state where a camera retracts according to Embodiment 1 of the present disclosure.
Figure 6:
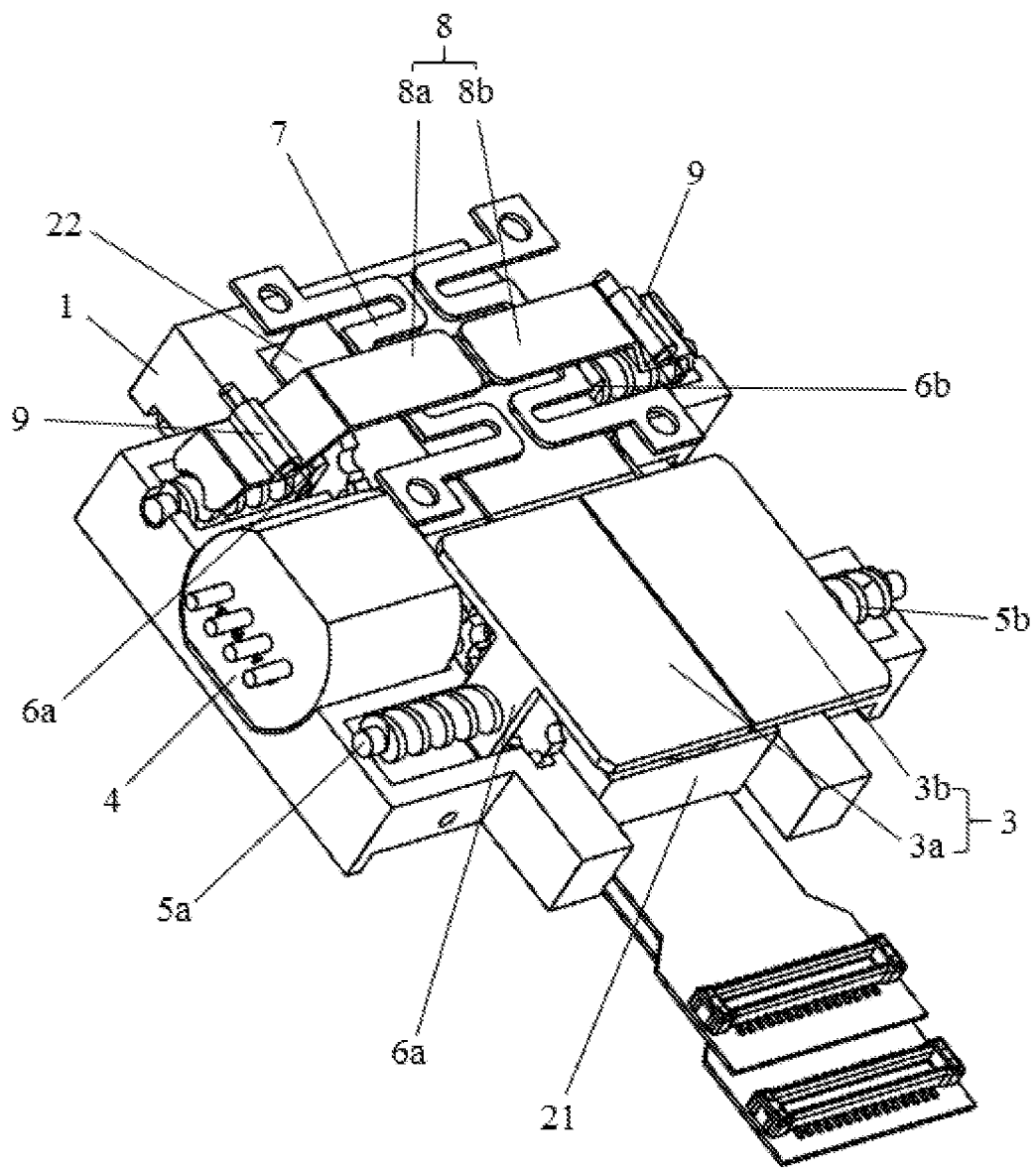
Figure 7:
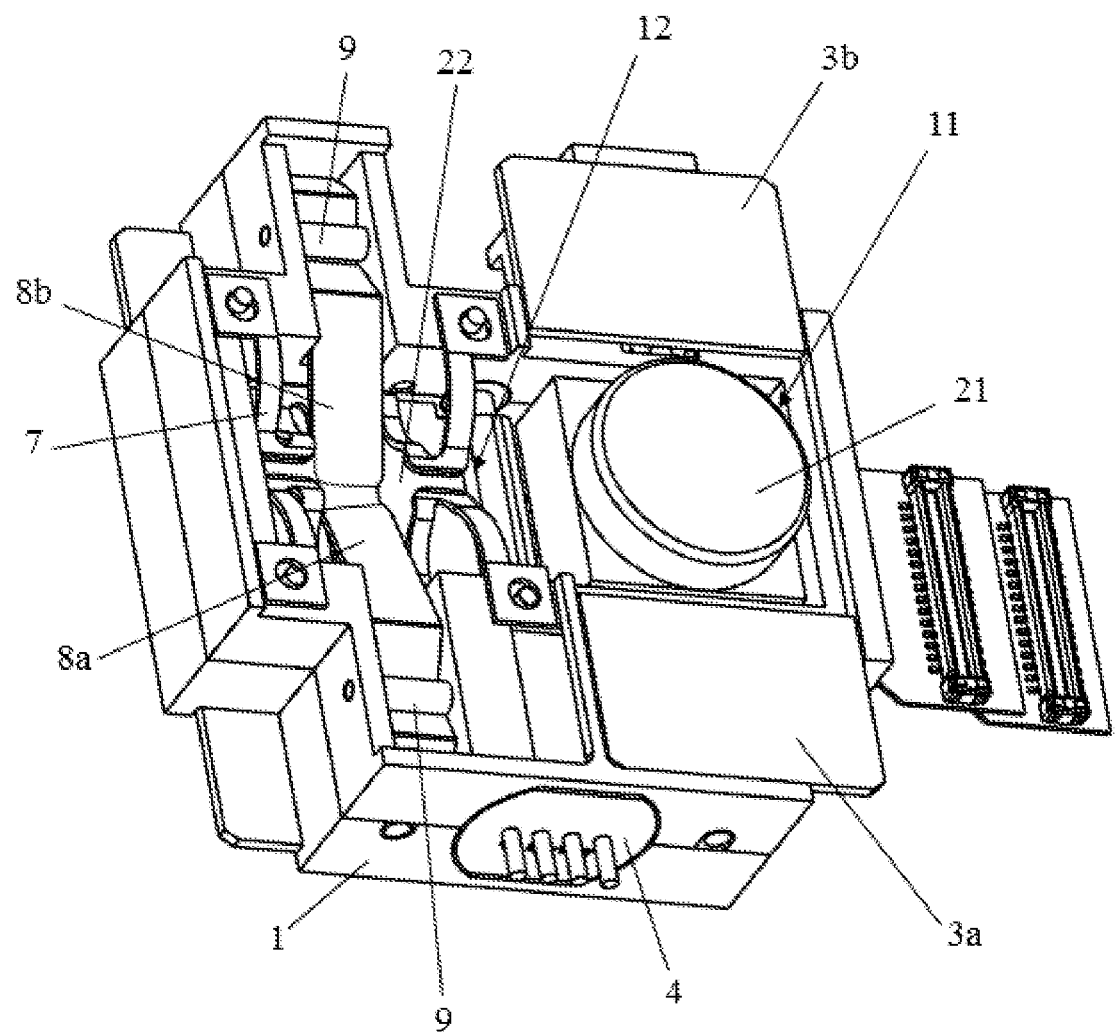
FIG. 7 and FIG. 8 are perspective schematic structural views of the telescopic camera mechanism in a state where the camera extends out according to Embodiment 1 of the present disclosure.
Figure 8:
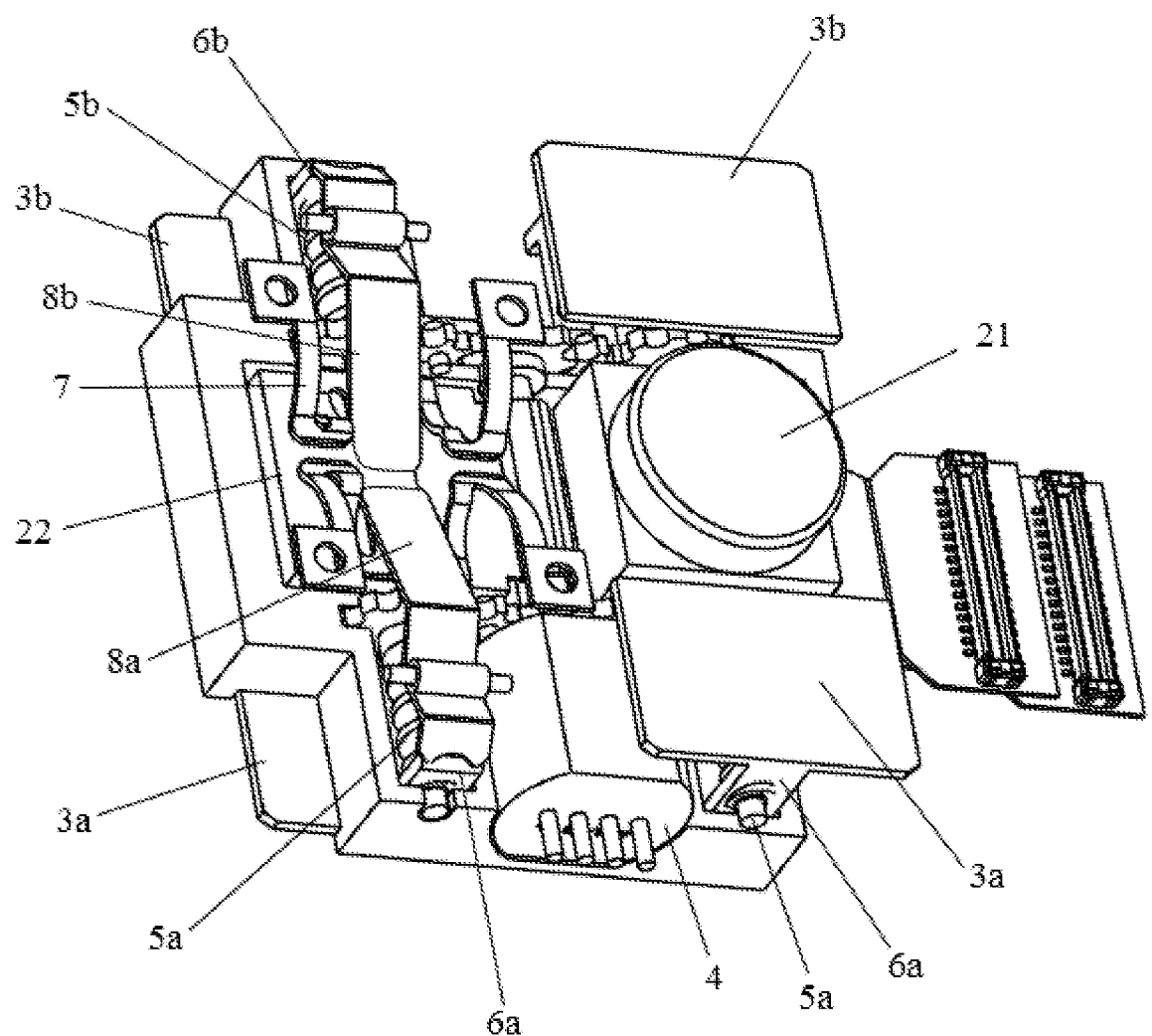

Specifically, as shown in FIG. 3-FIG. 8, the protective cover movement component mainly includes a rotating motor 4, a screw rod 5, and a guide plate 6. The camera telescopic component mainly includes a support spring strip 7 and a poke rod 8. FIG. 3 and FIG. 4 are schematic structural views of the holder in this embodiment and illustrate assembly structures of the rotating motor 4 and the screw rod 5 in the holder 1. Compared with FIG. 3, in FIG. 4 the upper half part of the holder 1 is omitted mainly to more clearly illustrate the assembly structures of the rotating motor 4 and the screw rod 5 in the holder 1. FIG. 5 and FIG. 6 are perspective schematic structural views of the telescopic camera mechanism in this embodiment in a state where a camera retracts. Compared with FIG. 5, in FIG. 6 the upper half part of the holder 1 is omitted mainly to more clearly illustrate status structures of each component in the holder 1. FIG. 7 and FIG. 8 are perspective schematic structural views of the telescopic camera mechanism in this embodiment in a state where the camera extends out. Compared with FIG. 7, in FIG. 8 the upper half part of the holder 1 is omitted mainly to more clearly illustrate status structures of each component in the holder 1.

As shown in FIG. 3 and FIG. 4, the holder 1 in this embodiment may be equipped with two pairs of screw rods 5, which respectively correspond to the two cameras 21 and 22. The screw rods 5 may be connected to lateral faces of the holding cavities 11 and 12. The rotating motor 4 may be assembled between the two groups of screw rods 5, which are driven by the same rotating motor 4. Specifically, the rotating motor 4 may be connected to the screw rod 5 through a gear assembly. Of course, in other embodiments, each pair of screw rods 5 also may be respectively driven by different rotating motors 4.

As shown in FIG. 5-FIG. 8, the guide plate 6 may be sleeved on the screw rod 5, and a top end of the guide plate 6 may be fixedly connected to the protective cover 3. Driven by the rotating motor 4, the screw rod 5 rotates to drive the guide plate 6 to move on the screw rod 5 along a direction close to or away from the holding cavities 11 and 12 to drive the protective cover 3 to move, such that the cameras 21 and 22 are sheltered or exposed. The guide plate 6 may be provided with a screw hole fitting with the screw rod 5, and the guide plate 6 may be sleeved on the screw rod 5 through the screw hole.

As shown in FIG. 5-FIG. 8, the support spring strip 7 may be connected to bottoms of the cameras 21 and 22 and may be fixedly connected to the holder 1, and the poke rod 8 may be movably connected to the holder 1. When the guide plate 6 moves such that the cameras 21 and 22 are entirely exposed, the guide plate 6 applies an acting force to the poke rod 8 to press against the support spring strip 7, such that the cameras 21 and 22 extend out of the holding cavities 11 and 12. When the guide plate 6 moves towards the direction close to the holding cavities 11 and 12, the guide plate 6 relieves the acting force applied to the poke rod 8, such that the support spring strip 7 drives the cameras 21 and 22 to retract into the holding cavities 11 and 12. Specifically, the poke rod 8 may be rotatably connected to the holder 1 through a rotating shaft 9, a first end of the poke rod 8 extends to a relative upward side of the screw rod 5 away from an end of the holding cavities 11 and 12, and a second end of the poke rod 8 extends to a relative upward side of the support spring strip 7. The poke rod 8 forms a lever by taking the rotating shaft 9 as a pivot point. When the guide plate 6 presses against a first end of the poke rod 8, a second end of the poke rod 8 presses against the support spring strip 7. When the guide plate 6 relieves pressure against the first end of the poke rod 8, the second end of the poke rod 8 relieves pressure against the support spring strip 7.

Further, in this embodiment, as shown in FIG. 3-FIG. 8, the protective cover 3 may include a left protective cover 3a and a right protective cover 3b, and the protective cover movement component may include a left screw rod 5a, a right screw rod 5b, a left guide plate 6a, and a right guide plate 6b. The left screw rod 5a and the right screw rod 5b may be respectively connected to two opposite lateral faces of the holding cavities 11 and 12, the left guide plate 6a may be sleeved on the left screw rod 5a and may be connected to the left protective cover 3a, the right guide plate 6b may be sleeved on the right screw rod 5b and may be connected to the right protective cover 3b, and the left screw rod 5a and the right screw rod 5b may be synchronously driven by the rotating motor 4. The camera telescopic component may include a left poke rod 8a and a right poke rod 8b, wherein the left poke rod 8a may be positioned between the support spring strip 7 and the left guide plate 6a, and the right poke rod 8b may be positioned between the support spring strip 7 and the right guide plate 6b.

More specifically, in this embodiment, the left protective cover 3a and the right protective cover 3b, the left screw rod 5a and the right screw rod 5b, the left guide plate 6a and the right guide plate 6b, and the left poke rod 8a and the right poke rod 8b are bilaterally symmetrically assembled.

The above embodiments provide a telescopic camera mechanism. The camera mechanism may be provided with a protective cover, a protective cover movement component, and a camera telescopic component. When the camera is not in use, the camera telescopic component drives the camera to retract into the protective cover, such that the camera may be effectively protected. When the camera is in use, the protective cover movement component moves the protective cover such that the camera is exposed, then the camera telescopic component drives the camera to extend out, such that a photographing angle of the camera may be increased, and product competitiveness is enhanced.

Embodiment 2

Figure 9:
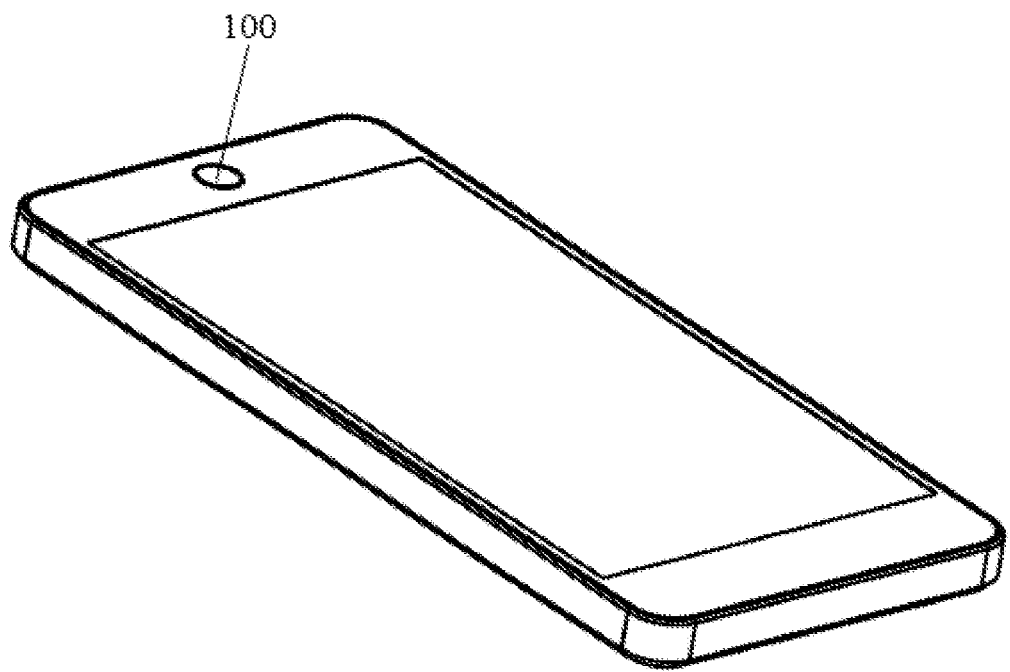
FIG. 9 is a schematic structural front view of an electronic device according to Embodiment 2 of the present disclosure.
Figure 10:
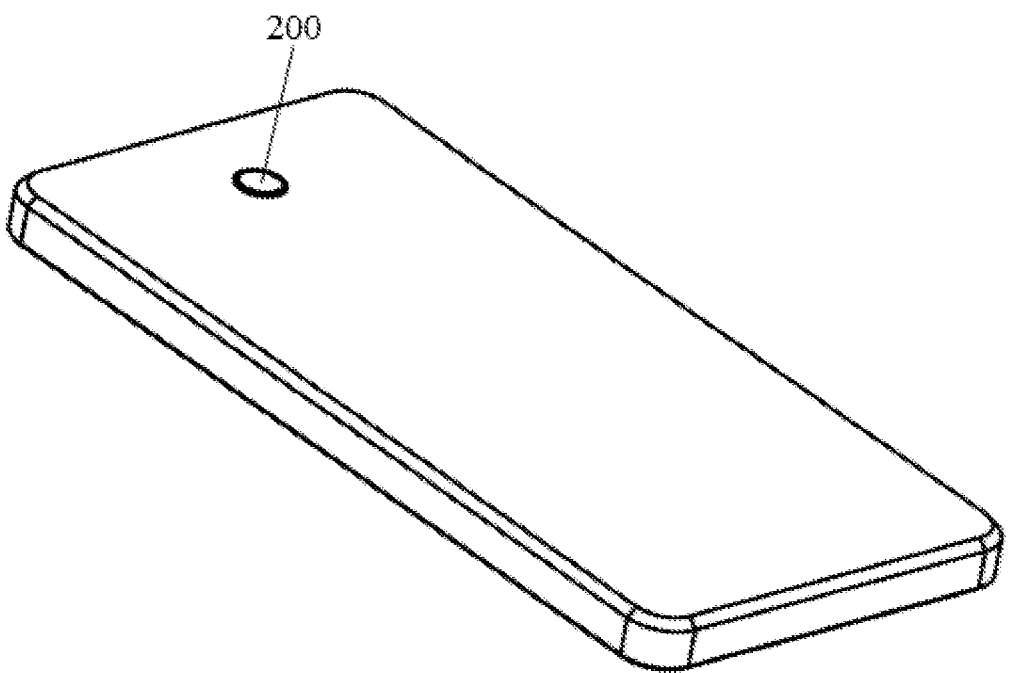
FIG. 10 is a schematic structural back view of the electronic device according to Embodiment 2 of the present disclosure.

This embodiment provides an electronic device, which specifically is a smart mobile phone or a tablet computer and may include a camera apparatus. The camera apparatus may employ the telescopic camera mechanism according to Embodiment 1 of the present disclosure. As shown in FIG. 9 and FIG. 10, the smart mobile phone may include a front camera 100 and a rear camera 200. The front camera 100 and the rear camera 200 respectively correspond to the camera 21 and the camera 22 in the telescopic camera mechanism according to Embodiment 1 of the present disclosure.

It is to be noted that a relational term (such as a first or a second) herein is merely intended to separate one entity or operation from another entity or operation instead of requiring or hinting any practical relation or sequence exists among these entities or operations. Furthermore, terms such as "comprise", "include" or other variants thereof are intended to cover a non-exclusive "comprise" so that a process, a method, a merchandise or a device comprising a series of elements not only includes these elements, but also includes other elements not listed explicitly, or also includes inherent elements of the process, the method, the merchandise or the device. In the case of no more restrictions, elements restricted by a sentence "may include a" do not exclude the fact that additional identical elements may exist in a process, a method, a merchandise or a device of these elements.

What is mentioned above merely refers to specific embodiments of this application. It shall be pointed out that to those of ordinary skill in the art, various improvements and embellishments may be made without departing from the principle of this application, and these improvements and embellishments are also deemed to be within the scope of protection of this application.

What is claimed is:

1. A telescopic camera mechanism, comprising a holder having a holding cavity, a camera placed in the holding cavity, a top of the camera provided with a protective cover, wherein the holder is further equipped with a protective cover movement component and a camera telescopic component, wherein the protective cover movement component comprises a rotating motor, a screw rod, and a guide plate; the screw rod is connected to a lateral face of the holding cavity, the guide plate is sleeved on the screw rod, a top end of the guide plate is fixedly connected to the protective cover; driven by the rotating motor, the screw rod rotates to drive the guide plate to move on the screw rod along a direction close to or away from the holding cavity to drive the protective cover to move, such that the camera is sheltered or exposed;

the camera telescopic component comprises a support spring strip and a poke rod, the support spring strip is connected to a bottom of the camera and is fixedly connected to the holder, the poke rod is movably connected to the holder; when the guide plate moves such that the camera is entirely exposed, the guide plate applies an acting force to the poke rod to press against the support spring strip, such that the camera extends out of the holding cavity; when the guide plate moves towards the direction close to the holding cavity, the guide plate relieves the acting force applied to the poke rod, such that the support spring strip drives the camera to retract into the holding cavity;

the poke rod is rotatably connected to the holder through a rotating shaft, a first end of the poke rod extends to a relative upward side of the screw rod away from an end of the holding cavity, and a second end of the poke rod extends to a relative upward side of the support spring strip; when the guide plate presses against the first end of the poke rod, the second end of the poke rod presses against the support spring strip; when the guide plate relieves pressure against the first end of the poke rod, the second end of the poke rod relieves pressure against the support spring strip;

the protective cover comprises a left protective cover and a right protective cover, and the protective cover movement component comprises a left screw rod, a right screw rod, a left guide plate, and a right guide plate; wherein the left screw rod and the right screw rod are respectively connected to two opposite lateral faces of the holding cavity, the left guide plate is sleeved on the left screw rod and is connected to the left protective cover, the right guide plate is sleeved on the right screw rod and is connected to the right protective cover, and the left screw rod and the right screw rod are synchronously driven by the rotating motor; and the poke rod comprises a left poke rod and a right poke rod, the left poke rod is positioned between the support spring strip and the left guide plate, and the right poke rod is positioned between the support spring strip and the right guide plate.

2. The telescopic camera mechanism according to claim 1, wherein the guide plate is provided with a screw hole fitting with the screw rod, the guide plate is sleeved on the screw rod through the screw hole, and the rotating motor is connected to the screw rod through a gear assembly.

3. The telescopic camera mechanism according to claim 1, wherein the left protective cover and the right protective cover, the left screw rod and the right screw rod, the left guide plate and the right guide plate, and the left poke rod and the right poke rod are bilaterally symmetrically assembled at two opposite sides of the holding cavity; two cameras configured towards opposite directions are placed in the holding cavity; wherein a top of each of the cameras is respectively provided with one protective cover, each of the cameras is correspondingly provided with the protective cover movement component and the camera telescopic component.

4. The telescopic camera mechanism according to claim 3, wherein two protective cover movement components corresponding to the two cameras share the rotating motor.

5. A telescopic camera mechanism, comprising a holder having a holding cavity, a camera placed in the holding cavity, a top of the camera provided with a protective cover, wherein the holder is further equipped with a protective cover movement component and a camera telescopic component, wherein the protective cover movement component comprises a rotating motor, a screw rod, and a guide plate; the screw rod is connected to a lateral face of the holding cavity, the guide plate is sleeved on the screw rod, a top end of the guide plate is fixedly connected to the protective cover; driven by the rotating motor, the screw rod rotates to drive the guide plate to move on the screw rod along a direction close to or away from the holding cavity to drive the protective cover to move, such that the camera is sheltered or exposed;

the camera telescopic component comprises a support spring strip and a poke rod, the support spring strip is connected to a bottom of the camera and is fixedly connected to the holder, the poke rod is movably connected to the holder; when the guide plate moves such that the camera is entirely exposed, the guide plate applies an acting force to the poke rod to press against the support spring strip, such that the camera extends out of the holding cavity; when the guide plate moves towards the direction close to the holding cavity, the guide plate relieves the acting force applied to the poke rod, such that the support spring strip drives the camera to retract into the holding cavity.

6. The telescopic camera mechanism according to claim 5, wherein the guide plate is provided with a screw hole fitting with the screw rod, and the guide plate is sleeved on the screw rod through the screw hole.

7. The telescopic camera mechanism according to claim 5, wherein the rotating motor is connected to the screw rod through a gear assembly.

8. The telescopic camera mechanism according to claim 5, wherein the poke rod is rotatably connected to the holder through a rotating shaft, a first end of the poke rod extends to a relative upward side of the screw rod away from an end of the holding cavity, and a second end of the poke rod extends to a relative upward side of the support spring strip; when the guide plate presses against the first end of the poke rod, the second end of the poke rod presses against the support spring strip; and when the guide plate relieves pressure against the first end of the poke rod, the second end of the poke rod relieves pressure against the support spring strip.

9. The telescopic camera mechanism according to claim 5, wherein the protective cover comprises a left protective cover and a right protective cover, and the protective cover movement component comprises a left screw rod, a right screw rod, a left guide plate, and a right guide plate; wherein the left screw rod and the right screw rod are respectively connected to two opposite lateral faces of the holding cavity, the left guide plate is sleeved on the left screw rod and is connected to the left protective cover, the right guide plate is sleeved on the right screw rod and is connected to the right protective cover, and the left screw rod and the right screw rod are synchronously driven by the rotating motor; and the camera telescopic component comprises a left poke rod and a right poke rod, the left poke rod is positioned between the support spring strip and the left guide plate, and the right poke rod is positioned between the support spring strip and the right guide plate.

10. The telescopic camera mechanism according to claim 9, wherein the left protective cover and the right protective cover, the left screw rod and the right screw rod, the left guide plate and the right guide plate, and the left poke rod and the right poke rod are bilaterally symmetrically assembled at two opposite sides of the holding cavity.

11. The telescopic camera mechanism according to claim 5, wherein two cameras configured towards opposite directions are placed in the holding cavity; and wherein a top of each of the cameras is respectively provided with one protective cover, and each of the cameras is correspondingly provided with the protective cover movement component and the camera telescopic component.

12. The telescopic camera mechanism according to claim 11, wherein two protective cover movement components corresponding to the two cameras share the rotating motor.

13. The telescopic camera mechanism according to claim 8, wherein two cameras configured towards opposite directions are placed in the holding cavity; and wherein a top of each of the cameras is respectively provided with one protective cover, each of the cameras is correspondingly provided with the protective cover movement component and the camera telescopic component.

14. An electronic device, comprising a holder having a holding cavity, a camera placed in the holding cavity, a top of the camera provided with a protective cover, wherein the holder is further equipped with a protective cover movement component and a camera telescopic component, wherein
   the protective cover movement component comprises a rotating motor, a screw rod, and a guide plate; the screw rod is connected to a lateral face of the holding cavity, the guide plate is sleeved on the screw rod, a top end of the guide plate is fixedly connected to the protective cover; driven by the rotating motor, the screw rod rotates to drive the guide plate to move on the screw rod along a direction close to or away from the holding cavity to drive the protective cover to move, such that the camera is sheltered or exposed; and
   the camera telescopic component comprises a support spring strip and a poke rod, the support spring strip is connected to a bottom of the camera and is fixedly connected to the holder, the poke rod is movably connected to the holder; when the guide plate moves such that the camera is entirely exposed, the guide plate applies an acting force to the poke rod to press against the support spring strip, such that the camera extends out of the holding cavity; when the guide plate moves towards the direction close to the holding cavity, the guide plate relieves the acting force applied to the poke rod, such that the support spring strip drives the camera to retract into the holding cavity.

15. The electronic device according to claim 14, wherein the electronic device is a smart mobile phone or a tablet computer.

16. The electronic device according to claim 14, wherein the guide plate is provided with a screw hole fitting with the screw rod, the guide plate is sleeved on the screw rod through the screw hole, and the rotating motor is connected to the screw rod through a gear assembly.

17. The electronic device according to claim 14, wherein the poke rod is rotatably connected to the holder through a rotating shaft, a first end of the poke rod extends to a relative upward side of the screw rod away from an end of the holding cavity, and a second end of the poke rod extends to a relative upward side of the support spring strip; when the guide plate presses against the first end of the poke rod, the second end of the poke rod presses against the support spring strip; and when the guide plate relieves pressure against the first end of the poke rod, the second end of the poke rod relieves pressure against the support spring strip.

18. The electronic device according to claim 14, wherein the protective cover comprises a left protective cover and a right protective cover, and the protective cover movement component comprises a left screw rod, a right screw rod, a left guide plate, and a right guide plate; wherein the left screw rod and the right screw rod are respectively connected to two opposite lateral faces of the holding cavity, the left guide plate is sleeved on the left screw rod and is connected to the left protective cover, the right guide plate is sleeved on the right screw rod and is connected to the right protective cover, and the left screw rod and the right screw rod are synchronously driven by the rotating motor; and
   the camera telescopic component comprises a left poke rod and a right poke rod, the left poke rod is positioned between the support spring strip and the left guide plate, and the right poke rod is positioned between the support spring strip and the right guide plate.

19. The electronic device according to claim 18, wherein the left protective cover and the right protective cover, the left screw rod and the right screw rod, the left guide plate and the right guide plate, and the left poke rod and the right poke rod are bilaterally symmetrically assembled at two opposite sides of the holding cavity.

20. The electronic device according to claim 19, wherein two cameras configured towards opposite directions are placed in the holding cavity; wherein a top of each of the cameras is respectively provided with one protective cover, each of the cameras is correspondingly provided with the protective cover movement component and the camera telescopic component; and two protective cover movement components corresponding to the two cameras share the rotating motor.

* * * * *